(12) United States Patent
Nawa (10) Patent No.: US 6,405,346 B1
(45) Date of Patent: Jun. 11, 2002

(54) METHOD FOR OPTIMIZING POWER SUPPLY WIRING IN A SEMICONDUCTOR INTEGRATED CIRCUIT

(75) Inventor: Takanori Nawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/473,962

(22) Filed: Dec. 29, 1999

(30) Foreign Application Priority Data

Jun. 8, 1999 (JP) .......................................... 11-161038

(51) Int. Cl.[7] .............................................. G06F 17/50
(52) U.S. Cl. ............................................... 716/2
(58) Field of Search .............................. 716/2, 6, 11, 12

(56) References Cited

U.S. PATENT DOCUMENTS 6,208,950 B1 * 3/2001 Chiba ......................... 702/191

* cited by examiner

Primary Examiner—Matthew Smith
Assistant Examiner—Thuan Do
(74) Attorney, Agent, or Firm—Arent Fox Kintner Plotkin & Kahn, PLLC (57) ABSTRACT

A design method optimizes the dimensions (length and width) of power supply lines in a semiconductor integrated circuit. First, the power supply lines are analyzed to determine initial values for the lines. Then, a current-capacitance ratio of each of the power supply lines is calculated using the analysis results. Finally, a dimension of each of the poser supply lines is computed so that the corresponding current-capacitance ratio is within a predetermined range. The resulting power supply lines are as narrow as possible without causing a voltage drop violation or a current amount violation.

32 Claims, 9 Drawing Sheets

| |
|---|
| Current Value of Power Supply=5mA |
| L1 : Width=2, Length=5 , Resistance=1Ω, Current Capacitance=4mA |
| L2 : Width=1, Length=5 , Resistance=2Ω, Current Capacitance=2mA |
| L3 : Width=2, Length=10, Resistance=2Ω, Current Capacitance=4mA |

| |
|---|
| Current Value of Power Supply=5mA |
| L1a: Width=1, Length=5, Resistance=2Ω, Current Capacitance =2mA |
| L2 : Width=1, Length=5, Resistance=2Ω, Current Capacitance =2mA |
| L3a: Width=1.5, Length=10, Resistance=8/3Ω, Current Capacitance =3mA |

```
.subckt sample n1 n3 n7 n9
R_h1 n1 n2 R=100  (TYPE1 L=1000 W=100)
R_h2 n2 n3 R=60   (TYPE1 L=600  W=100)
R_h3 n4 n5 R=200  (TYPE1 L=1000 W=50 )
R_h4 n5 n6 R=120  (TYPE1 L=600  W=50 )
R_h5 n7 n8 R=100  (TYPE1 L=1000 W=100)
R_h6 n8 n9 R=60   (TYPE1 L=600  W=100)
R_v1 n1 n4 R=40   (TYPE1 L=400  W=100)
R_v2 n4 n7 R=40   (TYPE1 L=400  W=100)
R_v3 n2 n5 R=80   (TYPE1 L=400  W=50 )
R_v4 n5 n8 R=80   (TYPE1 L=400  W=50 )
R_v5 n3 n6 R=40   (TYPE1 L=400  W=100)
R_v6 n6 n9 R=40   (TYPE1 L=400  W=100)
I11 n2   I=5e-3
I12 n4   I=5e-3
I13 n5   I=2e-3
I14 n6   I=3e-3
I15 n8   I=3e-3
.ends
```

Fig.9

| | Current-Capacitance Ratio | Line Width |
|---|---|---|
| L11 | 0.313 | 100 |
| L12 | 0.185 | 50 |
| L13 | 0.228 | 100 |
| L14 | 0.270 | 100 |
| L15 | 0.131 | 50 |
| L16 | 0.196 | 100 |

Fig.10

| | Current-Capacitance Ratio | Line Width |
|---|---|---|
| L11a | 0.836 | 41 |
| L12a | 0.868 | 8 |
| L13a | 0.928 | 23 |
| L14a | 0.965 | 28 |
| L15a | 0.971 | 5 |
| L16a | 0.924 | 20 |

Fig.11

```
.subckt sample n1 n3 n7 n9
R_h1 n1 n2 R=244  (TYPE1 L=1000 W=41)
R_h2 n2 n3 R=146  (TYPE1 L=600  W=41)
R_h3 n4 n5 R=1250 (TYPE1 L=1000 W=8 )
R_h4 n5 n6 R=750  (TYPE1 L=600  W=8 )
R_h5 n7 n8 R=435  (TYPE1 L=1000 W=23)
R_h6 n8 n9 R=261  (TYPE1 L=600  W=23)
R_v1 n1 n4 R=143  (TYPE1 L=400  W=28)
R_v2 n4 n7 R=143  (TYPE1 L=400  W=28)
R_v3 n2 n5 R=800  (TYPE1 L=400  W=5 )
R_v4 n5 n8 R=800  (TYPE1 L=400  W=5 )
R_v5 n3 n6 R=200  (TYPE1 L=400  W=20)
R_v6 n6 n9 R=200  (TYPE1 L=400  W=20)
I11 n2   I=5e-3
I12 n4   I=5e-3
I13 n5   I=2e-3
I14 n6   I=3e-3
I15 n8   I=3e-3
.ends
```
~52a

Fig.12

|  | Relative Value of Current-Capacitance Ratio | Line Width |
|---|---|---|
| L11b | 0.999 | 73 |
| L12b | 0.985 | 15 |
| L13b | 0.988 | 46 |
| L14b | 0.991 | 58 |
| L15b | 0.939 | 11 |
| L16b | 0.982 | 40 |

Fig.13

```
.subckt sample n1 n3 n7 n9
R_h1 n1 n2 R=137  (TYPE1 L=1000 W=73)
R_h2 n2 n3 R=82   (TYPE1 L=600  W=73)
R_h3 n4 n5 R=667  (TYPE1 L=1000 W=15)
R_h4 n5 n6 R=400  (TYPE1 L=600  W=15)
R_h5 n7 n8 R=217  (TYPE1 L=1000 W=46)
R_h6 n8 n9 R=130  (TYPE1 L=600  W=46)
R_v1 n1 n4 R=69   (TYPE1 L=400  W=58)
R_v2 n4 n7 R=69   (TYPE1 L=400  W=58)
R_v3 n2 n5 R=364  (TYPE1 L=400  W=11)
R_v4 n5 n8 R=364  (TYPE1 L=400  W=11)
R_v5 n3 n6 R=100  (TYPE1 L=400  W=40)
R_v6 n6 n9 R=100  (TYPE1 L=400  W=40)
I11 n2 I=5e-3
I12 n4 I=5e-3
I13 n5 I=2e-3
I14 n6 I=3e-3
I15 n8 I=3e-3
.ends
```
~52b

Fig.14

METHOD FOR OPTIMIZING POWER SUPPLY WIRING IN A SEMICONDUCTOR INTEGRATED CIRCUIT

BACKGROUND OF THE INVENTION

The present invention relates to a semiconductor integrated circuit, and more particularly, to a method and apparatus for designing the optimal power supply wiring in a semiconductor integrated circuit and to a recording medium storing a program for performing the method.

The optimization of the widths of power supply lines is important when laying out the power supply lines on an IC chip. Wide power supply lines occupy a large amount of area and thus limit the signal line area and the logic cell area. It is thus preferred that narrow power supply lines be used. However, the amount of current (current capacitance) that flows through a narrow power supply line is small. As a result, a current violation may occur. Current violation refers to a state in which wire breakage or deterioration (electromigration) may occur due to a large amount of current flowing through the line. Further, since the resistance of the line increases as the width of the line is narrowed, a voltage drop that exceeds a certain level (voltage drop violation) occurs. The voltage drop violation may cause the IC to function abnormally. Accordingly, there is a demand for a method that determines the minimum width of the power supply lines without causing a voltage drop violation or a current amount violation.

The optimal power supply line for an IC is one that does not have redundacy and has acceptable current capacitance and voltage drop levels. In a first prior art method for designing the optimal power supply line, the power supply network is analyzed to determine the assumed amount of current that will flow through the line. If the value of the assumed current amount exceeds the current capacitance of the line, the line width is increased from its originally designed width in order to increase the current capacitance. This avoids a current capacitance violation. The power supply network is then analyzed again to check whether the voltage drop is lower than a predetermined limit value. If there is a voltage drop violation, the width of certain lines are increased. Another check for violations is then made. These processes are repeated until the line width is optimized.

However, in the first prior art method, if the width of certain lines are increased to avoid a voltage drop violation when there is no current violation on any of the power supply lines, the increase in the width of the lines is not as effective as it should be for avoiding the voltage drop violation. The rate of current flowing through each power supply line changes by increasing the width of certain lines. As a result, current amount violations may occur at new locations.

In a second prior art method, the widths of all of the lines are increased to avoid voltage drop violations without changing the current rate. However, in this method, the widths of the lines having surplus current capacitance with respect to the actual current amount, or lines having redundant current capacitance are also increased. This increases redundancy and the amount of unnecessarily occupied area.

Figure 1A:
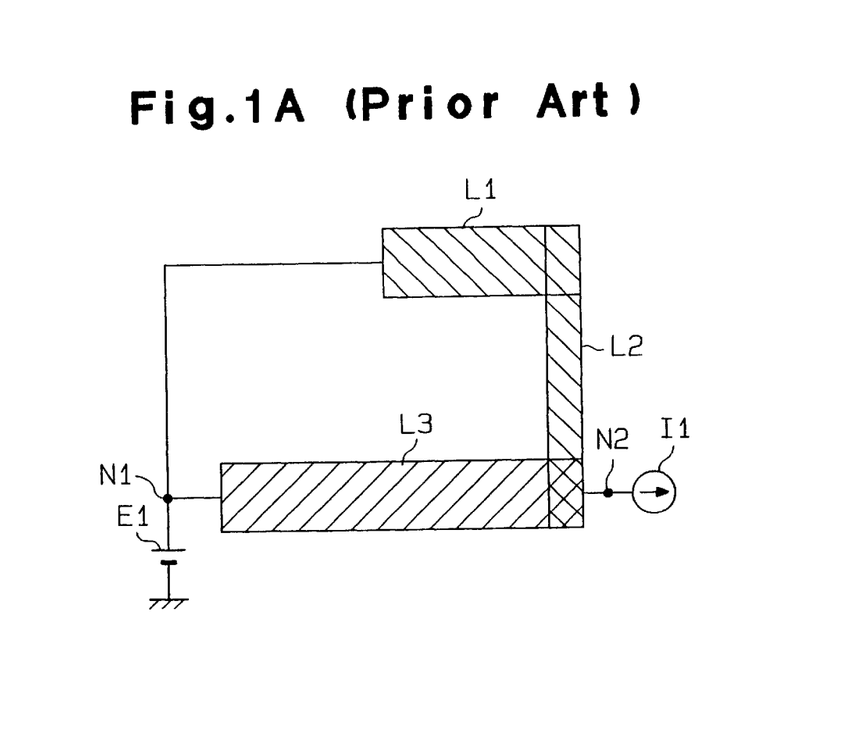
FIG. 1A is a diagrammatic view showing a power supply circuit in order to describe the prior art power supply wiring design method.
Figure 1B:
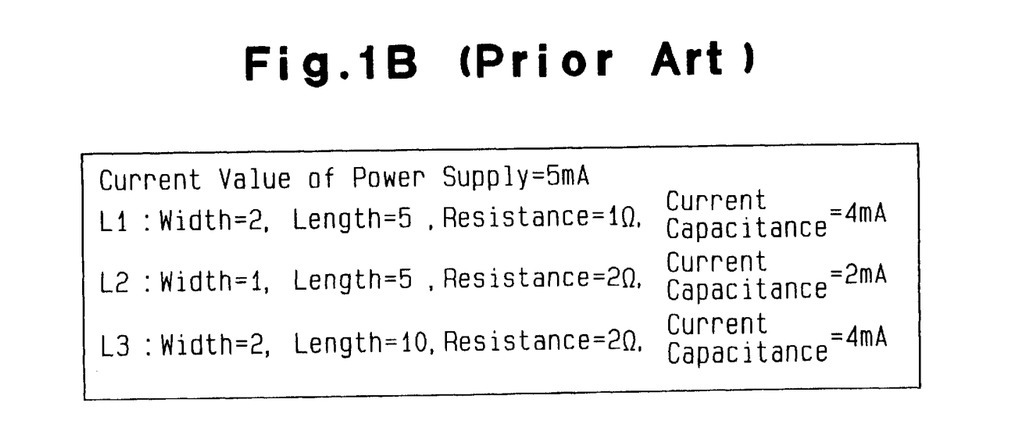
FIG. 1B is a table showing the dimensions and electrical characteristics of the power supply circuit of FIG. 1A.

The second prior art method will now be described with reference to FIGS. 1A and 1B. FIG. 1A shows a power supply wiring having a node N1 connected to a power supply E1 and a node N2 connected to a current supply I1. The nodes N1 and N2 are connected by power supply lines L1, L2, L3. The table of FIG. 1B shows the width and length of each of the lines L1–L3. A current of 2 mA flows through lines L1, L2, and a current of 3 mA flows through line L3. The potential at node N2 is lower than the potential at node N1 by 6 mV. In other words, the voltage drop value of the power supply wiring shown in FIG. 1A is 6 mV.

The voltage drop at node N2 with respect to node N1 may be changed to, for example, 4 mV or lower. Under such condition, if the width of line L2 is doubled, the voltage drop value is 5 mV. If the width of line L1 is doubled, the voltage drop is still no longer 4 mV or lower.

Line Li has a current capacitance of 4 mA. However, since a current of 2 mA flows through line L1, line L1 has extra or redundant capacitance. Thus, an increase in the width of line L1 further increases redundancy. This also increases the amount of current flowing through lines L1, L2 and causes a current amount violation at line L2.

If the width of all of the lines L1, L2, L3 are increased by 1.5 times, the voltage drop value at node N2 is 4 mV. However, this line width increase would further increase the redundancy of lines L1, L3 and the amount of unnecessarily occupied area on the IC chip.

When the width of line L3 is increased by two times, the voltage drop value at node N2 is 3.75 mV, which is an allowable voltage drop level. Thus, in the wiring of FIG. 1A, the most effective way to satisfy the voltage drop reference value is to increase the width of line L3. However, an actual IC is more complicated than the wiring of FIG. 1A. Hence, determining the line which most effectively satisfies the voltage drop standard level when the width is changed is extremely difficult.

In other words, if the width of certain power supply lines are changed, the current amount at other lines changes. This may cause current amount violations at lines whose widths were not changed. Further, the change in voltage drop differs depending on the line whose width is changed. Thus, there may be cases in which power supply drop violations cannot be avoided.

If the width of every line is increased, the current amount rate between each line will not change but the width of lines already having redundancy will be further increased. Accordingly, such wire layout has many redundant portions. If every line width is decreased, the current amount rate between each line will not change, but the lines that do not have redundancy will also be narrowed. Accordingly, current amount violations are apt to occur in such a wire layout.

Additionally, in the prior art, although current amount violation and voltage drop violation were checked, reduction of redundancy in the wiring was difficult.

SUMMARY OF THE INVENTION

Accordingly, it is an object of the present invention to provide a method and apparatus for designing the optimal power supply wiring.

To achieve the above object, the present invention provides a design method for optimizing the dimensions of a plurality of power supply lines. The design method includes the steps of analyzing each of the power supply lines, computing a current-capacitance ratio of each of the power supply lines based on the analysis results, and computing a dimension of each of the power supply lines so that the corresponding current-capacitance ratio is within a predetermined range.

Another aspect of the present invention provides a design apparatus for optimizing the dimensions of a plurality of power supply lines. The apparatus includes a processor unit including an analyzing device for analyzing each of the plurality of power supply lines, a first computing device for computing a current-capacitance ratio of each of the power supply lines based on the analysis results, and a second computing device for computing a width of each of the power supply lines so that the corresponding current-capacitance ratio is within a predetermined range.

A further aspect of the present invention provides a computer readable medium for recording a program for optimizing the dimensions of a plurality of power supply lines. The program includes comprising the steps of analyzing each of the plurality of power supply lines, computing a current-capacitance ratio of each of the power supply lines based on the analysis results, and computing a dimension of each of the power supply lines so that the corresponding current-capacitance ratio is included in a predetermined range.

A further aspect of the present invention provides a method for optimally designing a plurality of power supply lines including the steps of checking a current value of each of the plurality of power supply lines, computing a current-capacitance ratio of each of the plurality of power supply lines from an allowable current value of the plurality of power supply lines and the corresponding current value, and computing a dimension of at least one of the plurality of power supply lines so that the corresponding current-capacitance ratio is within a predetermined range.

A further aspect of the present invention provides an apparatus for optimally designing a plurality of power supply lines. The apparatus includes a computation processing unit including a checking device for checking a current value of each of the plurality of power supply lines, a first computing device for computing a current-capacitance ratio of each of the plurality of power supply lines from an allowable current value and the corresponding current value, and a second computing device for computing a dimension of at least one of the plurality of power supply lines so that the corresponding current-capacitance ratio is within a predetermined range.

A further aspect of the present invention provides a computer readable recording medium having recorded thereon program code for optimally designing a plurality of power supply lines. The program code includes means for checking a current value of each of the plurality of power supply lines, means for computing a current-capacitance ratio of each of the power supply lines from an allowable current value and the corresponding current value, and means for computing the dimension of each of the plurality of power supply lines so that the corresponding current-capacitance ratio is within a predetermined range.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

The present invention will now be described with reference to FIGS. 2 to 14.

Figure 3:
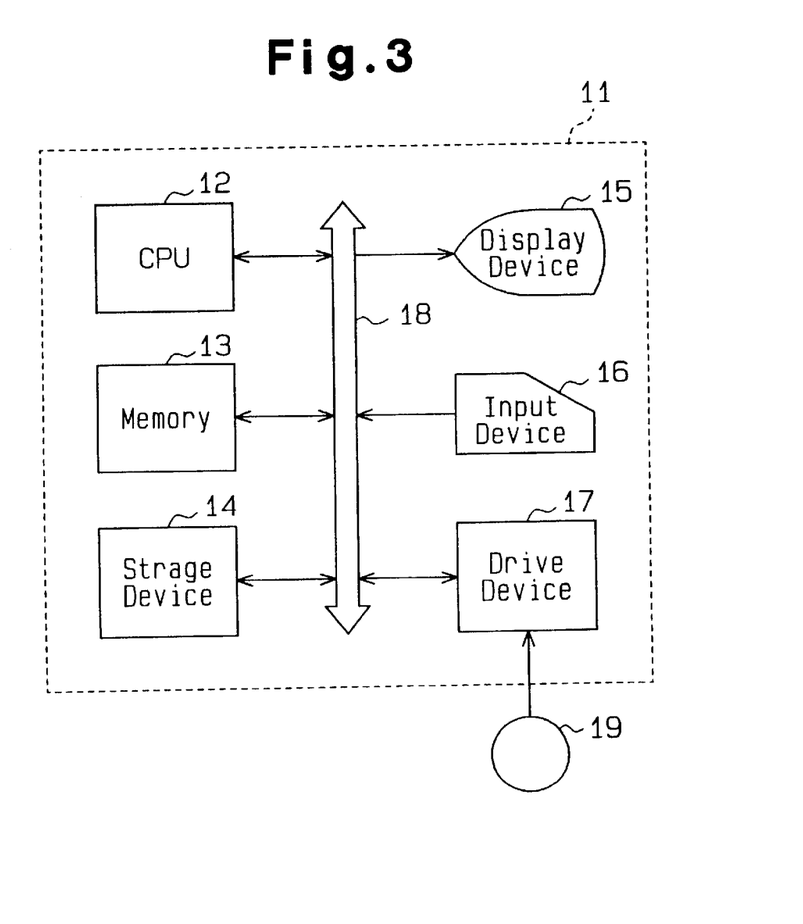
FIG. 3 is a schematic block diagram showing a power supply wiring design apparatus according to the present invention.

As shown in FIG. 3, a power supply wiring design apparatus 11 is a CAD apparatus including a central processing unit (CPU) 12, a memory 13, a storage device 14, a display device 15, an input device 16, a drive device 17, and a bus 18 for connecting the devices 12–17 to one another.

The memory 13 stores programs and data used to design the power supply wiring and normally includes a cache memory, a system memory, and a display memory. The CPU 12 executes program instructions to design an IC power supply wiring in accordance with the program.

The display device 15 displays a layout picture and a parameter input picture. A cathode ray tube (CRT), a liquid crystal display (LCD), or a plasma display panel (PDP) may be used as the display device 15. The input device 16 is used to input user commands and parameters. The input commands and parameters are sent to the CPU 12. A keyboard and mouse device (not shown) may be used as the input device 16.

The storage device 14 includes a magnetic disk device, an optical disk device, and a magneto-optical disk device. The storage device 14 stores power supply wiring design program data and first to seventh files 21–27, shown in FIGS. 2A and 2B. In response to a user command, the CPU 12 transfers the program and data from the storage device 14 to the memory 13 and executes the program. The storage device 14 may also store a data base.

The drive device 17 reads information, including programs and data, stored on a recording medium 19. The program and data recorded on the recording medium 19 are read by the drive device 17 and transferred to the storage device 14, and then loaded into the memory 13, as necessary. A computer readable recording medium, such as a magnetic tape (MT), a memory card, a floppy disk, an optical disk (CD-ROM, DVD-ROM), and a magneto-optical disk (MO, MD), may be used as the recording medium 19.

Figure 2A:
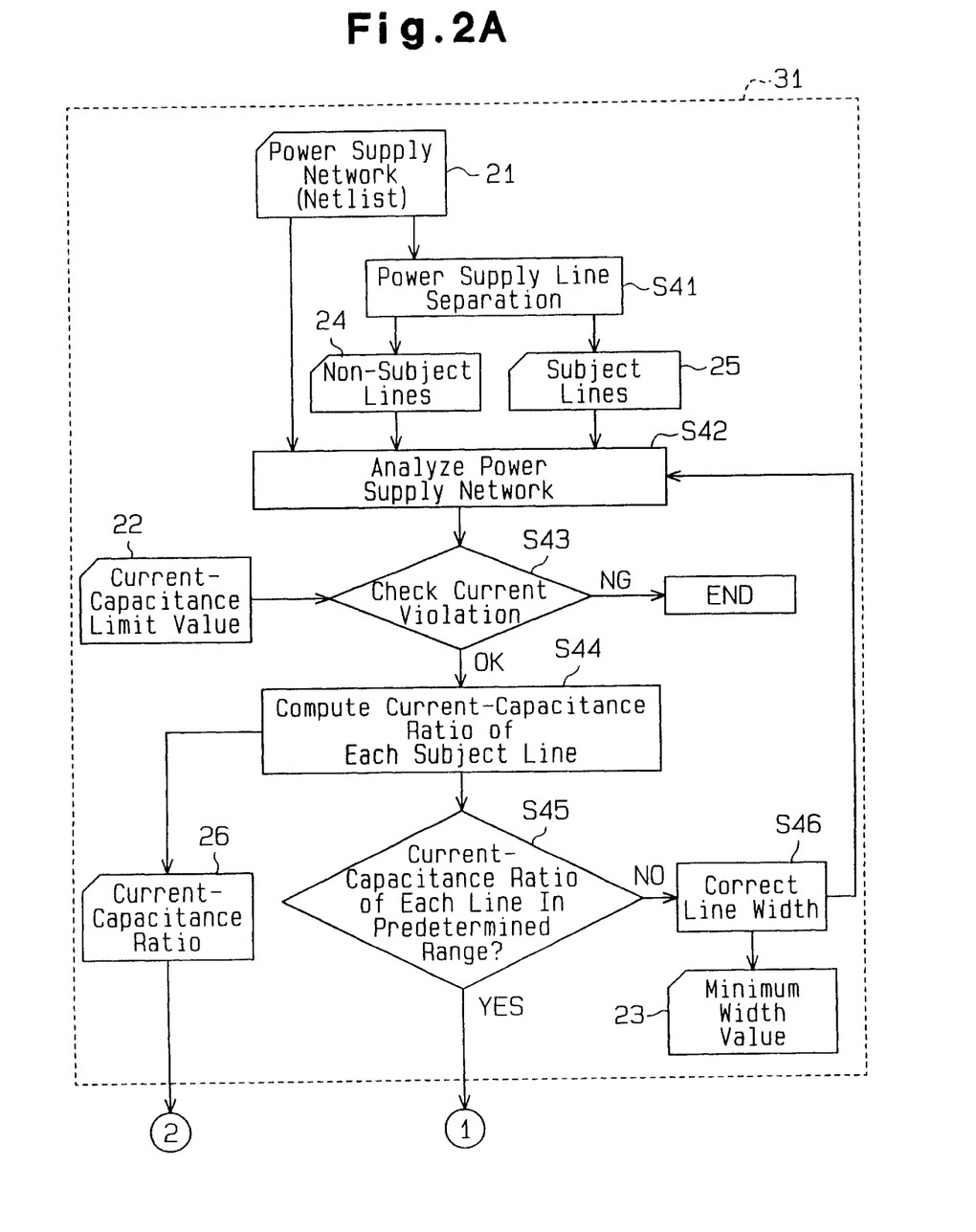
FIGS. 2A and 2B show a flowchart illustrating a power supply wiring design method according to the present invention.
Figure 2B:
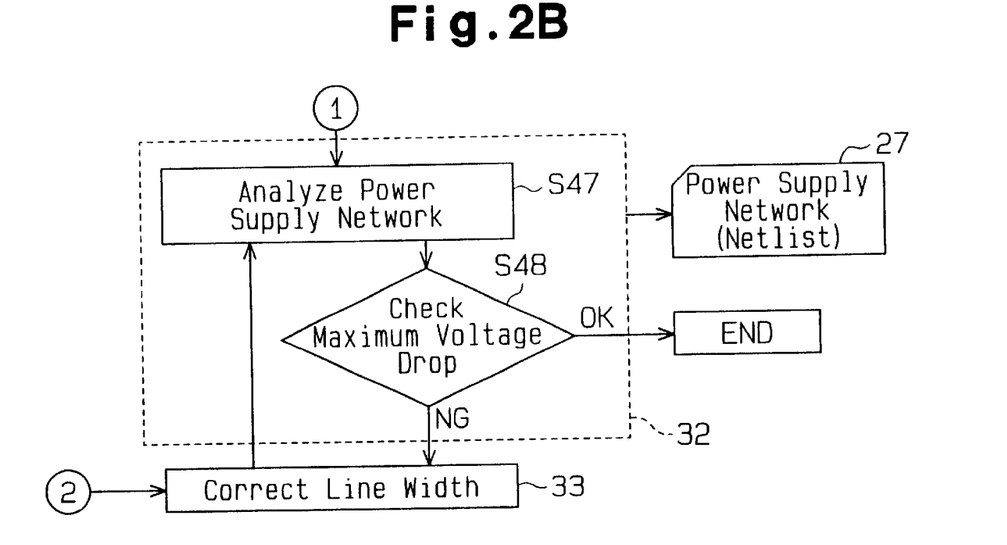

With reference to FIGS. 2A and 2B, the first file 21 stores the design data of a semiconductor integrated circuit (IC) chip, the circuit layout of which has been designed by, for example, the CAD apparatus (not shown). The design data includes power supply network data (netlist). The CPU 12 shown in FIG. 3 receives the netlist from the first file 21 and designs the power supply wiring based on the netlist.

The second file 22 stores a current capacitance limit value. The CPU 12 checks for current violations in the power supply wiring based on the current capacitance limit value.

The third file 23 stores a minimum width value, which indicates the manufacturing limit. A power supply line having a width narrower than the manufacturing limit may be designed but cannot be manufactured. Hence, if the width of a power supply line computed through the power supply wiring design process is narrower than the limit, the CPU 12 uses the minimum width value instead. Accordingly, power supply lines having widths wide enough to allow manufacture are designed.

The fourth file 24 stores information of the power supply lines subject to optimization, and the fifth file 25 stores information of the power supply lines that are not subject to optimization. The power supply wiring includes lines having fixed widths, such as those defining standard cells. Therefore, power supply lines that are subject to optimization must be distinguished from those that are not subject to optimization. If all of the power supply lines are subject to optimization, the fourth and fifth files 24, 25 may be eliminated.

The sixth file 26 stores the current-capacitance ratio of each power supply line. The power supply lines are optimized when the current-capacitance ratio is included in a predetermined range.

The seventh file 27 stores the resulting netlist of the power supply network subsequent to optimization.

The first to seventh files 21–27 are distinguished from one another in accordance with the function of the stored data. Multiple types of data may be stored in a single file or a single type of data may be divided and stored in a multiple number of files. Among the files 21–27, files storing temporary data may be provided in the memory 13 shown in FIG. 3.

The power supply wiring design process includes a first process 31 for computing a candidate value of the line width, a second process 32 for checking voltage drop violation, and a third process 33 for correcting the line width candidate value.

In the first process 31, the CPU 12 analyzes the power supply network based on the netlist stored in the first file 21. The width of each power supply line is then changed in accordance with the analysis results so that the ratio of the current amount flowing through each line relative to the current capacitance is within a predetermined range.

The power supply wiring includes lines for providing the power along the surface of the IC chip substrate and via holes for providing the power in a direction perpendicular to the substrate. In this power supply wiring design process, the area of the via holes are handled in the same manner as the widths of the power supply lines.

The first process 31 includes steps S41–S46.

In step S41, the CPU 12 separates the power supply wiring included in the netlist into lines subject to optimization (hereafter referred to as subject lines) and lines that are not subject to optimization (hereafter referred to as non-subject lines). The widths of the subject lines are changed through the subsequent steps.

In step S42, the CPU 12 analyzes the power supply network. At step S43, the CPU 12 checks whether or not the width of each power supply line results in a current amount violation. If a current amount violation is found in the non-subject lines in step S43, the CPU 12 terminates the power supply wiring design process. In such case, the layout of the entire IC chip is redesigned since the widths of the non-subject lines are designated as fixed and are not to be changed.

If a current amount violation is not found in the non-subject lines in step S43, the CPU 12 proceeds to step S44 and computes the current-capacitance ratio of each subject line as discussed below. The current-capacitance ratio refers to the ratio between the value of the current flowing through each subject line and the allowable current value (current capacitance) of the subject line. That is, current-capacitance ratio=current value/allowable current value. The CPU 12 stores the current-capacitance ratio of each line in the sixth file 26.

In step S45, the CPU 12 checks whether the current-capacitance ratio of each subject line is within a predetermined range. If the current-capacitance ratio is not within the predetermined range, the CPU 12 proceeds to step S46 and corrects the width of the lines having a current-capacitance ratio outside of the predetermined range.

The predetermined range is set in order to obtain the optimal power supply lines. The optimal power supply line refers to one that does not violate the current amount or voltage drop and has a width with small redundancy. A power supply line having small redundancy with respect to the current capacitance refers to one in which the current amount flowing through the wire is substantially the same as the current capacitance, that is, the current-capacitance ratio is one or lower, and close to one. If the current-capacitance ratio is greater than one, the current flowing through the line is more than the current capacitance. Such a line violates the allowable current amount.

For example, if the current-capacitance ratio is 0.5, the redundancy of that power supply line is two times greater with respect to the current capacitance of the line. Accordingly, the predetermined range is set to between one or lower and a value close to one (preferably about 0.8 to 1).

The width of each of the subject lines obtained in step S46 puts the associated current-capacitance ratio in the predetermined range and optimizes the subject wires. The voltage drop value of each subject line is not taken into consideration in step S46 so that the redundancy optimization is not hindered.

In step S46, if the obtained line width is narrower than the minimum width stored in the third file 23, the value of the minimum width is employed as the width of that line. This prevents the design of a power supply wiring having lines with widths that cannot be manufactured.

After correcting the line width in step S46, the CPU 12 proceeds to step S42 and analyzes the power supply network again. This is because new current amount violations may occur since the change in the line width varies the resistance of the subject lines and changes the current amount flowing through the subject lines.

The CPU 12 repeats steps S42 to S46 until there are no current amount violations in any of the power supply lines regardless of changes in the line widths. When there are no current amount violations and the current-capacitance ratio of each line is within the predetermined range, the CPU 12 proceeds to the second process 32 from the first process 31.

The second process 32 checks whether or not there is a voltage drop violation in the power supply network.

At step S47, the CPU 12 analyzes the power supply network. At step S48, the CPU 12 determines whether or not the maximum voltage drop value obtained during the analysis exceeds a voltage drop limit value. If there is no voltage drop violation, the CPU 12 terminates the power supply wiring design process. In this case, the analyzed and optimized power supply network (netlist) is stored in the seventh file 27.

If it is determined that there is a voltage drop violation in step S48, the CPU 12 proceeds to a third process 33.

In the third process 33, the CPU 12 increases the current capacitance of all of the subject wires based on the relationship between the maximum voltage drop value and the limit voltage drop value. The current capacitance of a power supply line may be increased by widening or thickening the line or by providing additional power supply lines. To increase the number of power supply lines, additional lines may be superimposed on different layers, be laid out on the same plane, or be both superimposed on different layers and laid out on the same plane.

In the third process 33, the CPU 12 refers to each current-capacitance ratio stored in the sixth file 26. The CPU 12 obtains the width of each subject line while maintaining the same current-capacitance ratio relationship between the subject lines. Otherwise, the CPU 12 obtains the width of each line so that the current-capacitance ratio of each subject line approaches a predetermined value (e.g., 1.0).

The CPU 12 recomputes the line widths using the computed values that were not employed in step S46 (the value lower than the minimum width) in the third process 33. The line widths employing the minimum width in step S46 have redundancy since the computed value was not employed. Thus, the widening of the line to the minimum width would increase the redundancy of the line. To prevent an increase in redundancy, a new line width is obtained using the computed value that was not obtained in step S46.

If the newly computed value clears the minimum width condition, the CPU 12 updates the value of the line width with the computed value. If the computation value does not clear the minimum width condition (the computed value being smaller than the minimum width), the CPU 12 uses the minimum width as the new line width. This prevents the design of a power supply wiring having lines with widths that cannot be manufactured.

Referring now to FIGS. 1A–1B and 4A–4B, the optimization performed through the power supply wiring design process will now be described using the example of the power supply wiring pattern shown in FIG. 1A.

The power supply lines L1–L3 each have a width, length, resistance, and current capacitance, as shown in FIG. 1B. The voltage drop limit value is 4 mV. The CPU 12 first subjects all of the power supply lines L1, L2, L3 to optimization and analyzes the power supply network of the power supply wiring pattern (step S42). The current amounts 2 mA, 2 mA, 3 mA of the respective power supply lines L1, L2, L3 are obtained during the analysis. Since the current amounts do not exceed the current capacitance of the associated power supply lines, there is no current amount violation. Thus, the CPU 12 proceeds to step S44 and computes the current-capacitance ratio of each of the power supply lines L1–L3 in the following manner. The current-capacitance ratio of line L1=current amount 2 mA/current capacitance 4 mA=½, the current-capacitance ratio of line L2=current amount 2 mA/current capacitance 2 mA=1, the current-capacitance ratio of line L3=current amount 3 mA current capacitance 4 mA=¾.

The CPU 12 then computes the line widths (step S46) so that the associated current-capacitance ratio is included in the predetermined range (in this example, 0.8 to 1). The computation is performed for lines L1 and L3, which current-capacitance ratio is out of the predetermined range.

To make the current-capacitance ratio take a value of 1, the original line width is multiplied by the current-capacitance ratio. That is, the width of line L1 is multiplied by 0.5, and the width of line L3 is multiplied by 0.75. The resistance of each power supply line is inversely proportional to the line width. Thus, the resistance of line L1 is 2Ω, and the resistance of line L3 is 8/3Ω. Accordingly, the width, resistance, and current capacitance of new power supply lines L1a, L2, L3a are as follows:

line L1a; width=1, resistance=2Ω, current capacitance=2 mA;

line L2; width=1, resistance=2Ω, current capacitance=2 mA (no change); and line L3a; width=1.5, resistance=8/3Ω, current capacitance=3 mA.

When the power supply network is analyzed again under these conditions, the current-capacitance ratio of each of the power supply lines L1a, L2, L3a is computed as follows due to the change in the current amount flowing through the power supply lines:

current-capacitance ratio of line L1a is 1 since the current capacitance is 2 mA and the current amount is 2 mA;

current-capacitance ratio of line L2 is 1 since the current capacitance is 2 mA and the current amount is 2 mA; and current-capacitance ratio of line L3a is 1 since the current capacitance is 3 mA and the current amount is 3 mA.

Figure 4A:
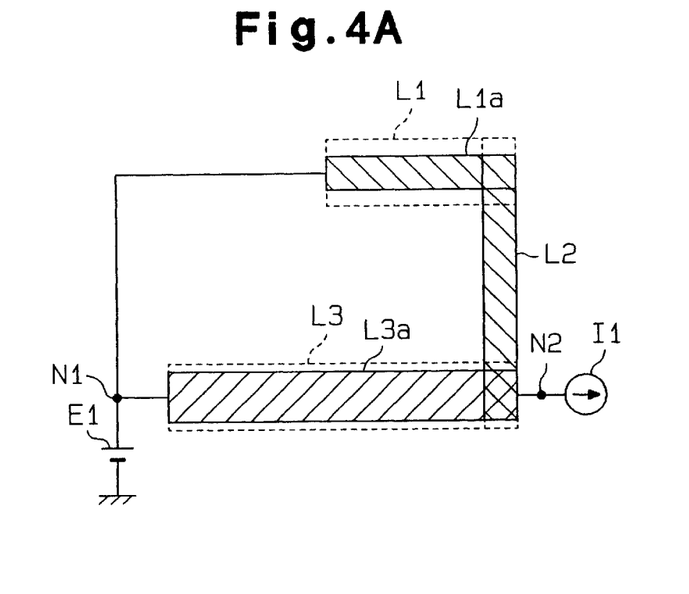
FIG. 4A is a diagrammatic view showing a first example of a power supply circuit in order to describe the power supply wiring design method.
Figure 4B:
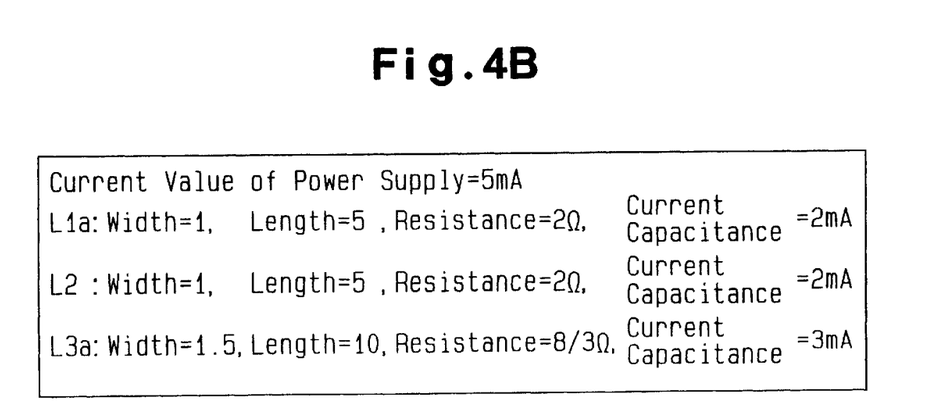
FIG. 4B is a table showing the dimensions and electrical characteristics of the power supply circuit of FIG. 4A.

Through the above process, the current-capacitance ratio of each of the power supply lines L1a, L2, L3a becomes included in the predetermined range (1 to 0.8). The image of the power supply lines L1a, L2, L3a is shown in FIG. 4A. The broken lines show the original power supply lines L1 and L3. The characteristics of the power supply lines L1a, L2, L3a are shown in FIG. 4B.

In the second process 32, the CPU 12 analyzes the modified power supply network formed by lines L1a, L2, L3a. The maximum voltage drop value of 8 mV at node N2 is obtained through the analysis. Since the maximum value (8 mV) exceeds the voltage drop limit value (4 mV), the CPU 12 performs the third process.

In the third process 33, the CPU 12 recomputes the widths of the power supply lines L1a, L2, L3a from the relationship between the voltage drop limit value (4 mV) and the voltage drop maximum value (8 mV). The new line width W2 is obtained from the original line width W1, the voltage drop maximum value Vdrop, and the voltage drop limit value Vlimit using the equation W2=Vdrop/Vlimit×W1.

Figure 5:
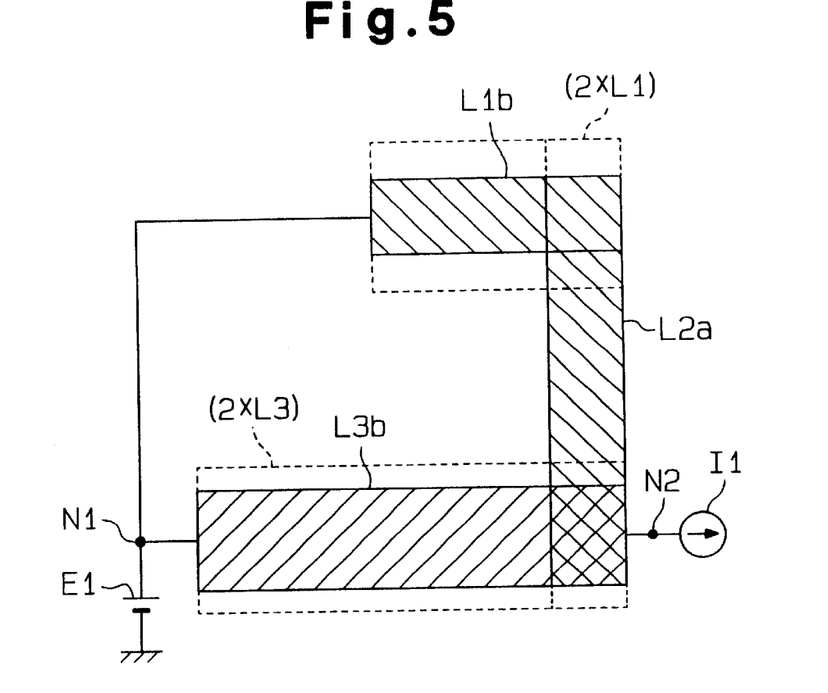
FIG. 5 is a diagrammatic view showing a second example of a power supply circuit in order to describe the power supply wiring design method.

As a result, the new power supply lines have widths two times those of the power supply lines L1a, L2, L3a. FIG. 5 shows the power supply lines L1*b*, L2*a*, L3*b* having the new widths. The broken lines of FIG. 5 hypothetically show power supply lines that would be obtained when multiplying the widths of the original power supply lines L1, L3 by two times.

The power supply lines L1*b*, L2*a*, L3*b* obtained in this manner cause the voltage drop value at node N2 to be 4 mV, which satisfies the voltage drop limit value condition. Further, the relative current-capacitance ratio relationship between the power supply lines is maintained. Thus, the current amount of lines L1*b*, L2*a* is 2 mA and the current amount of line L3*b* is 3 mA. Thus, a current violation does not occur.

Figure 6:
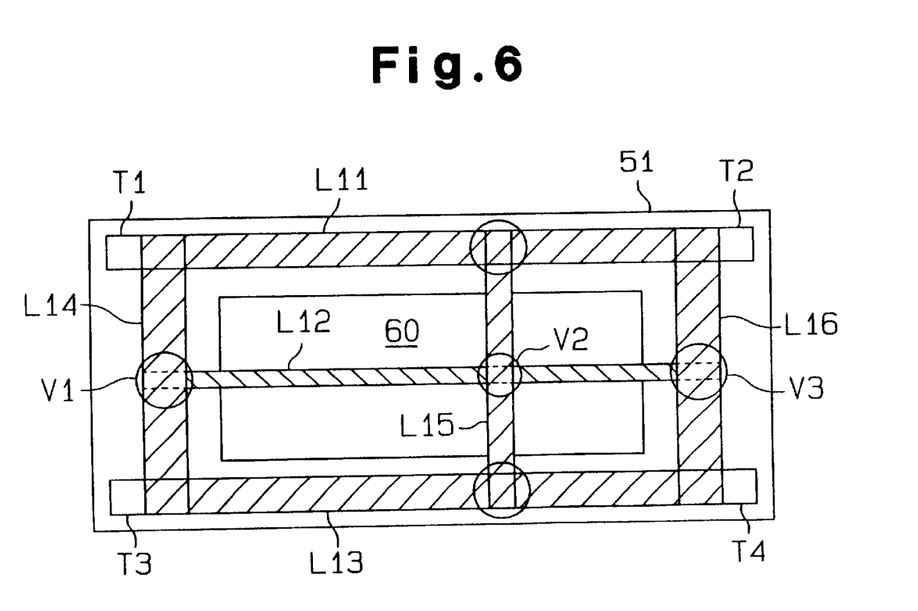
FIG. 6 is a diagrammatic view showing a third example of a power supply circuit network in order to describe the power supply wiring design method.

With reference to FIG. 6, the optimization performed through the power wiring design process will now be described using a second example of a power supply wiring pattern provided on an IC chip 51.

The IC chip 51 has power supply lines L11 to L16 for providing the power to an internal circuit 60 via external terminals T1–T4. Although the internal circuit 60 requires multiple types of power supplies, only one type of power supply is shown. Among the power supply lines L11–L16, line L12 is arranged on a different layer than the other lines L11, L13–L16. Line L12 is shown with cross-hatchings extending in a direction differing from the cross-hatchings of the other lines L11, L13–L16. Via holes V1, V2, V3 connect line L12 to lines L14, L15, L16. The optimization process is performed on lines L11 to L16.

In the second example, the current capacitance of each power supply line is obtained from the formula "line width× 0.1e–3[A]," the voltage drop limit value is set at 0.5[V], and the minimum width condition of the power supply lines is one.

Figure 7:
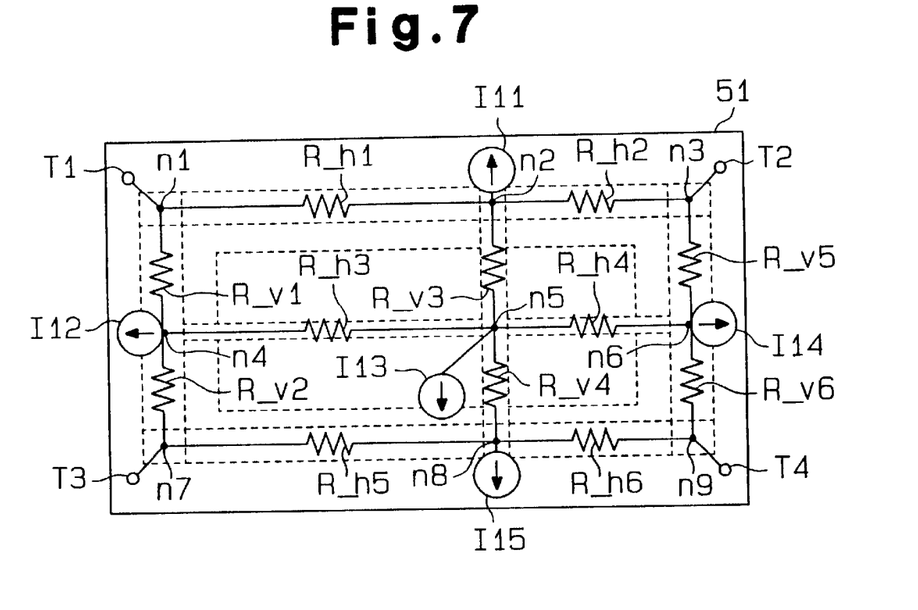
FIG. 7 is an equivalent circuit diagram of the power supply wiring pattern of FIG. 6.

FIG. 7 shows an equivalent circuit diagram of the power supply wiring pattern of FIG. 6.

In the power supply network of the IC chip 51, each of the power supply lines L11 to L16 are divided at nodes n1 to n9 and represented as resistors connecting the associated nodes. The power supply line L11 is represented by a resistor R_h1 having a resistance between nodes n1, n2 and a resistor R_h2 having a resistance between nodes n2, n3. The power supply line L12 is represented by resistors R_h3, R_h4. The power supply line L13 is represented by resistors R_h5, R_h6. The power supply line L14 is represented by resistors R_v1, R_v2. The power supply line L15 is represented by resistors R_v3, R_v4. The power supply line L16 is represented by resistors R_v5, R_v6. Current is supplied to the internal circuit 60 from current sources I11, I12, I13, I14, I15 which are respectively connected to the nodes n2, n4, n5, n6, n8 of the power supply lines L12, L15.

Figure 8:
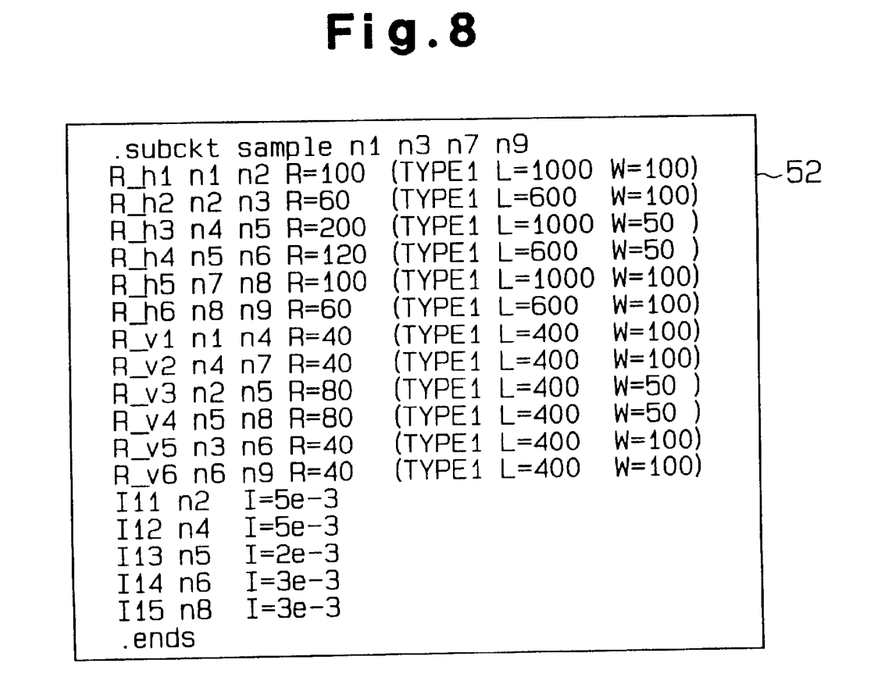
FIG. 8 is a netlist of the power supply circuit network of FIG. 7.

FIG. 8 is a netlist 52 corresponding to the power supply network of FIG. 7.

The netlist 52 lists the resistor identifications (R_h1 to R_h6), the nodes associated with each resistor, the resistance R (unit [Ω]), the wire length L, the wire width W, the node associated with each of the current sources I1–I5, and the current value I (unit [A]).

Figure 9:
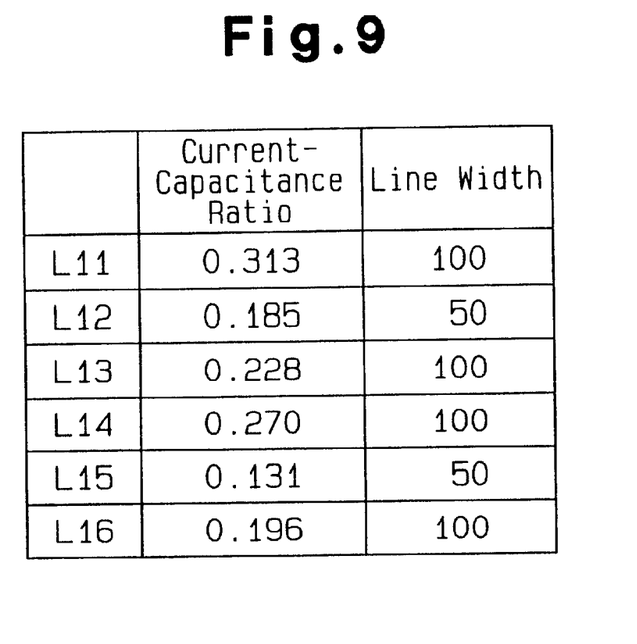
FIG. 9 is a table showing the current-capacitance ratio and line width when the power supply circuit network of FIG. 7 is in an initial state.

In this example, all of the lines are subject to optimization. The CPU 12 analyzes the power supply network of the netlist 52 of FIG. 8 and obtains the current-capacitance ratio of each power supply line L11–L16 (the current-capacitance ratio of the resistors R_h1 to R_h6 and R_v1 to R_v6 that correspond to the power supply lines L11–L16). The results are shown in FIG. 9.

The CPU 12 then changes the line widths so that the current-capacitance ratio of each of the power supply lines L11–L16 is within the predetermined range. Afterward, the CPU 12 analyzes the power supply network one more time.

The predetermined range is 1 to 0.8. The width of a power supply line having a current-capacitance ratio outside the predetermined range is corrected in accordance with the current-capacitance ratio. The new wire width is obtained from the following equation:

new wire width=current-capacitance ratio×wire width.

Figure 10:
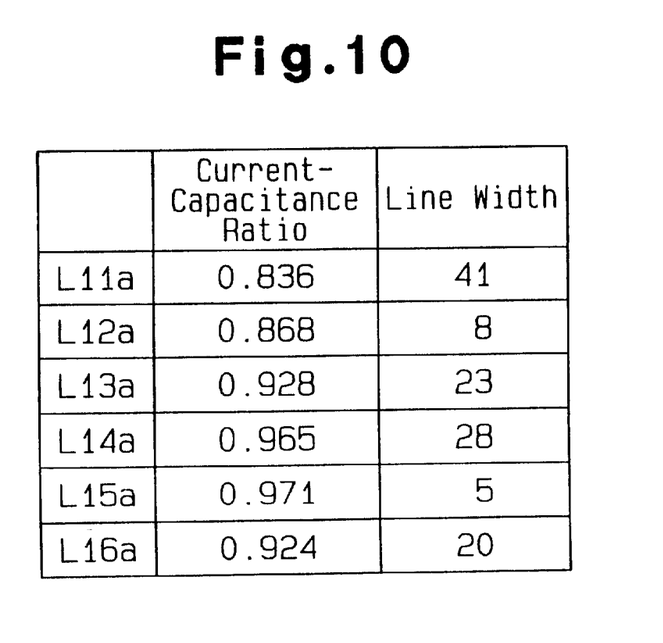
FIG. 10 is a table showing the current-capacitance ratio and line width after the power supply circuit network of FIG. 7 undergoes a first process.

The CPU 12 repeats the computation of the wire widths until the current/capacitance ratio of all of the lines is included in the range of 1 to 0.8 and obtains power supply lines L11*a*–L16*a* having new widths. FIG. 10 shows an example of the width combination of the power supply lines L11*a*-L16*a*. Other width combinations may also be obtained.

As shown in FIG. 10, all of the lines have a width greater than one and thus the minimum width condition is satisfied. The CPU 12 thus employs all of the computed values as the widths of the associated power supply lines L11*a*–L16*a*.

Figure 11:
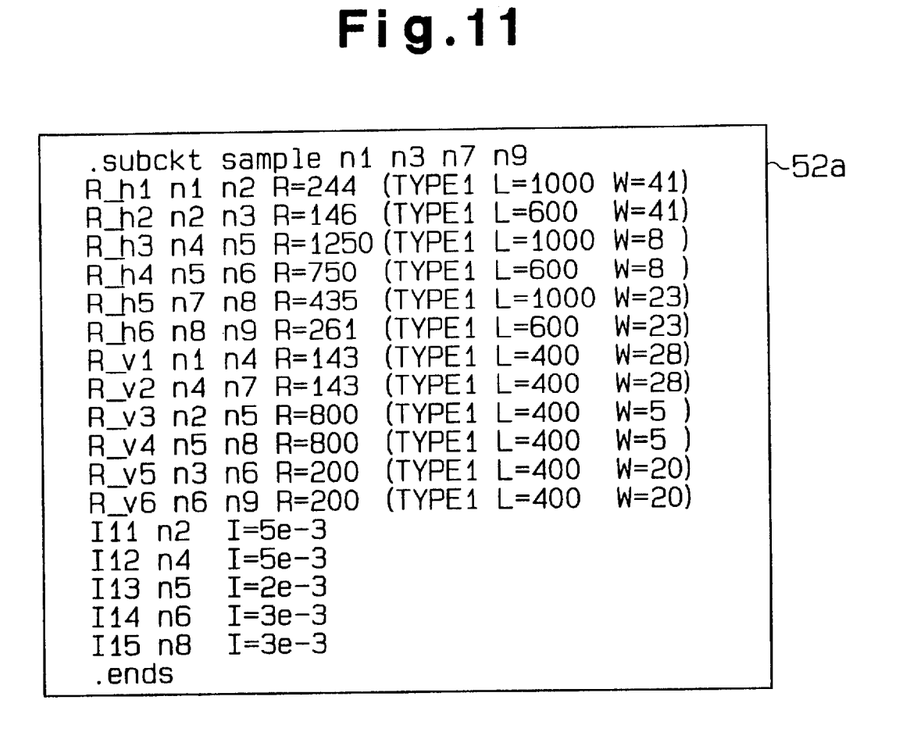
FIG. 11 is a netlist of the power supply circuit network of FIG. 7 after the first process is performed.

The netlist 52*a* subsequent to the first process is shown in FIG. 11. The CPU 12 analyzes the power supply network using the netlist 52*a*. From the analysis, the CPU 12 confirms the location and value of the maximum voltage drop, which, in this case, is at node n5 and has a value of about 0.9V. Since the voltage drop value at node n5 is greater than the voltage drop limit value (0.5V), there is a voltage drop violation. The CPU 12 thus performs the third process.

Figure 12:
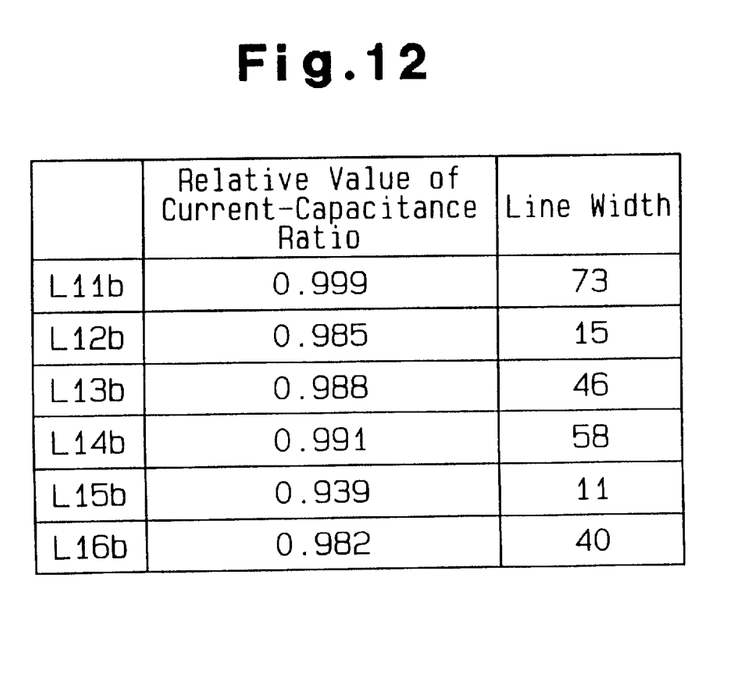
FIG. 12 is a table showing the current-capacitance ratio and line width after the power supply circuit network of FIG. 7 undergoes an optimization process.

To avoid a voltage drop violation at node n5, the CPU 12 increases the widths of all of the power supply lines L11*a*–L16*a* in the third process. The current-capacitance ratio decreases when the line width is increased. The width of the lines that are to be widened are computed using, for example, the equation shown below so that the relative value of the current-capacitance ratio of each power supply line L11*a*L16*a* approaches a predetermined value. The relative value of the current-capacitance ratio is set based on the current value of each of the power supply lines L11*a*–L16*a*. FIG. 12 shows the relative ratio of each power supply line with respect to the current-capacitance ratio of line L11*b*.

new line width=voltage drop maximum value/voltage drop limit value/current-capacitance ratio.

Figure 13:
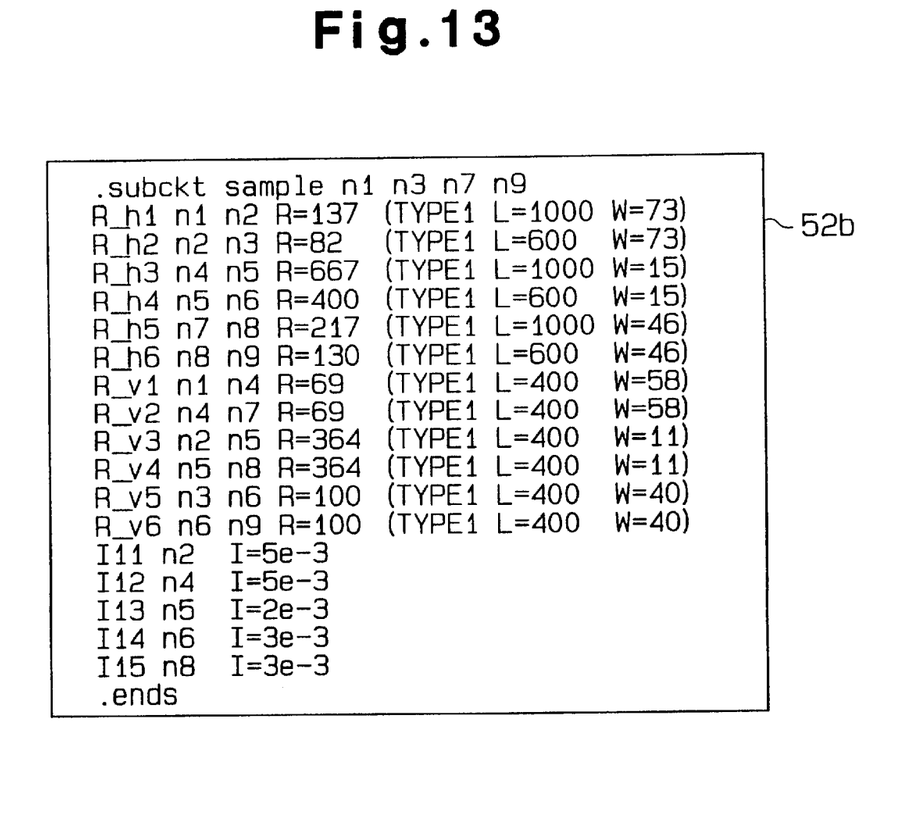
FIG. 13 is a netlist of the power supply circuit network of FIG. 7 after the optimization process is performed.

The CPU 12 repeats the second process 32 and the third process 33 using the computed line widths until there are no voltage drop violations. The final current-capacitance ratio relative values of the power supply lines L11*b*–L16*b* and the final line widths are shown in FIG. 12. The final netlist is shown in FIG. 13. The maximum voltage drop value subsequent to optimization is about 0.45V and taken at node n5. The voltage drop maximum value is smaller than the voltage drop limit value of 0.5V. Thus, voltage drop violations are avoided.

The preferred and illustrated embodiment has the advantages described below.

(1) In the first process 31, the CPU 12 analyzes the power supply network based on the netlist stored in the first file 21. The CPU 12 changes the line widths in accordance with the analysis results so that the ratio of the current amount relative to the current capacitance in each line is included in the predetermined ratio. As a result, the computed wire width is optimal with respect to the current amount. Accordingly, redundancy is minimized.

(2) In the second process 32, the CPU 12 analyzes the power supply network and checks whether or not there are any voltage drop violations. In the third process 33, the CPU 12 computes the line width based on the relationship between the maximum voltage drop value and the voltage drop limit value. This increases the current capacitance of all of the subject wires and causes the voltage drop of each line to be under the voltage drop limit.

(3) The power supply lines included in the netlist are divided into lines that are subject to optimization and lines that are not subject to optimization. The CPU 12 performs optimization on only the subject lines. Since the optimization is not performed on lines whose width cannot be changed, the time required for optimization is reduced.

(4) If the computed line width does not satisfy the minimum width condition, which is stored in the third file 23, the value of the minimum width is employed as the line width. This prevents the designing of a power supply wiring that cannot be manufactured.

(5) For lines that employ the minimum width when correcting the line width in step S46, the CPU 12 computes a new line width based on the computed value that was not employed. This prevents an increase in the redundancy of the power supply wiring.

It should be apparent to those skilled in the art that the present invention may be embodied in many other specific forms without departing from the spirit or scope of the invention. Particularly, it should be understood that the present invention may be embodied in the following forms. The preferred embodiment may be modified as described below.

The line width may be optimized for each resistor dividing the power supply lines L11–L16 (e.g., the resistors R_h1 and R_h2 in the power supply line L11). Among the power supply lines L11–L16, multiple power supply lines may be grouped together so that optimization is performed on only the lines of the group.

Certain power supply lines may be eliminated from the wires subject to optimization. For example, internal wiring data registered in the library data used for designing a standard cell (S/C) layout cannot be changed. Thus, the power supply lines corresponding to such data do not undergo optimization. The power supply lines can be classified into subject lines and non-subject lines in this manner when performing the first process. Subsequent to the first process 31, an auxiliary line is added if an allowable current amount violation occurs in the non-subject lines.

Figure 14:
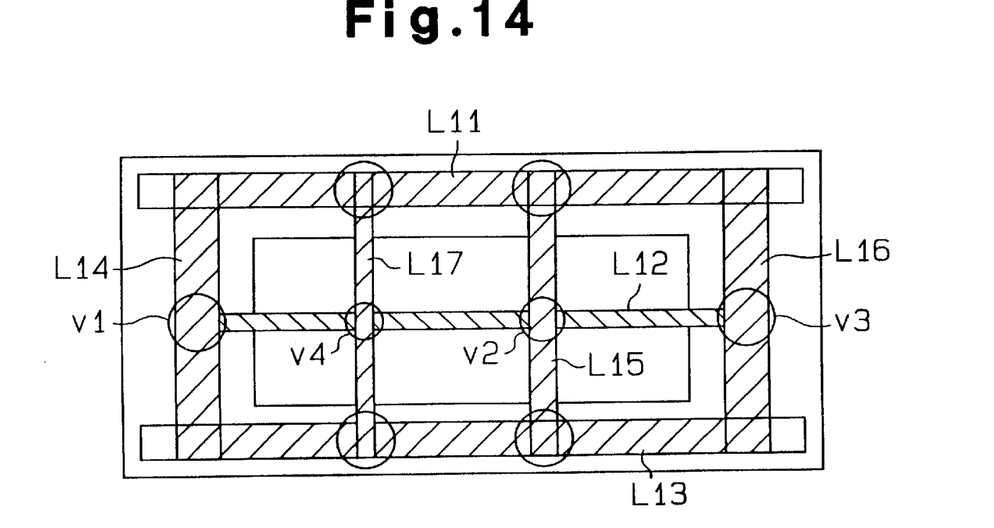
FIG. 14 is diagrammatic view showing a fourth example of a power supply circuit in order to describe the power supply wiring design method.

In the power supply wiring pattern of FIG. 6, if the power supply line L12 is not subject to optimization but violates the allowable current amount, an auxiliary line L17 is added as shown in FIG. 14. A via hole V4 connects the auxiliary line L17 to the line L12. The added line ensures the optimization of the power supply lines.

In the preferred embodiment, optimization is performed on only the power supply lines L11–L16. However, the via holes V1–V3 may also be subject to optimization.

If the line width computed in the third process 33 takes a value that is not allowed when designing the IC, the voltage drop limit value may be changed to a less severe value.

A maximum line width may be set so that the processing is temporarily interrupted when the computed value exceeds the value of the maximum line width. Power supply lines may be added and the processing may be started from the first process 31 again.

The present examples and embodiments are to be considered as illustrative and not restrictive, and the invention is not to be limited to the details given herein, but may be modified within the scope and equivalence of the appended claims.

What is claimed is:

1. A design method for optimizing the dimensions of a plurality of power supply lines, the design method comprising the steps of:

analyzing each of the power supply lines;

computing a current-capacitance ratio of each of the power supply lines based on the analysis results, wherein the current-capacitance ratio is the ratio of a current amount flowing through each of the power supply lines relative to the current capacitance of each of the power supply lines; and computing a dimension of each of the power supply lines so that the corresponding current-capacitance ratio is within a predetermined range.

2. The design method according to claim 1, wherein the current-capacitance ratio is computed from an allowable current value of the power supply lines and a current value of each of the power supply lines.

3. The design method according to claim 1, wherein the analyzing step analyzes a current value of each of the power supply lines.

4. The design method according to claim 1, wherein the dimensions of the power supply lines correspond to widths of the power supply lines.

5. A design apparatus for optimizing the dimensions of a plurality of power supply lines, wherein the apparatus includes a processor unit comprising:

an analyzing device for analyzing each of the plurality of power supply lines;

a first computing device for computing a current-capacitance ratio of each of the power supply lines based on the analysis results, wherein the current-capacitance ratio is the ratio of a current amount flowing through each of the power supply lines relative to the current capacitance of each of the power supply lines; and a second computing device for computing a width of each of the power supply lines so that the corresponding current-capacitance ratio is within a predetermined range.

6. The design apparatus according to claim 5, wherein the first computing device computes the current-capacitance ratio from an allowable current value of the plurality of power supply lines and a current value of each of the plurality of power supply lines.

7. The design apparatus according to claim 5, wherein the analyzing device analyzes a current value of each of the plurality of power supply lines.

8. A computer readable medium for recording a program for optimizing the dimensions of a plurality of power supply lines, the program comprising the steps of:

analyzing each of the plurality of power supply lines;

computing a current-capacitance ratio of each of the power supply lines based on the analysis results, wherein the current-capacitance ratio is the ratio of a current amount flowing through each of the power supply lines relative to the current capacitance of each of the power supply lines; and computing a dimension of each of the power supply lines so that the corresponding current-capacitance ratio is included in a predetermined range.

9. The medium according to claim 8, wherein the current-capacitance ratio computing step computes the current capacitance ratio from an allowable current value of the plurality of power supply lines and a current value of each of the plurality of power supply lines.

10. The medium according to claim 8, wherein the analyzing step analyzes a current value of each of the plurality of power supply lines.

11. A method for optimally designing a plurality of power supply lines comprising the steps of:
- checking a current value of each of the plurality of power supply lines;
- computing a current-capacitance ratio of each of the plurality of power supply lines from an allowable current value of the plurality of power supply lines and the corresponding current value, wherein the current-capacitance ratio is the ratio of a current amount flowing through each of the power supply lines relative to the current capacitance of each of the power supply lines; and
- computing a dimension of at least one of the plurality of power supply lines so that the corresponding current-capacitance ratio is within a predetermined range.

12. The design method according to claim 11, wherein the dimension of the at least one power supply line corresponds to a width of the power supply line.

13. The design method according to claim 11, further comprising:
- analyzing the plurality of power supply lines including the at least one power supply line having the computed dimension;
- determining the occurrence of a voltage drop violation in the plurality of power supply lines; and
- setting the computed dimension as the optimal dimension of the at least one power supply line when there is no voltage drop violation.

14. The design method according to claim 13, further comprising:
- correcting the computed dimension when a voltage drop violation in the power supply lines is determined in the determining step; and
- repeating the analyzing step, the determining step, and the correcting step until the voltage drop violation is avoided.

15. The design method according to claim 14, wherein the correcting step includes increasing the computed dimension while maintaining the relative relationship between the current-capacitance ratios of the plurality of power supply lines.

16. The design method according to claim 14, wherein the correcting step increases the computed dimension so that a relative value of each current-capacitance ratio approaches a predetermined value.

17. The design method according to claim 11, further comprising a separating step for separating the plurality of power supply lines into subject lines that are subject to optimization and non-subject lines that are not subject to optimization prior to the first analyzing step, wherein each of the subsequent steps are performed on the subject lines.

18. The design method according to claim 11, wherein the dimension computing step includes comparing the computed dimension with a predetermined minimum value, the computed dimension being employed as the line dimension when the computed dimension is equal to or greater than the minimum value, and the predetermined minimum value being employed as the line dimension when the computed dimension is less than the minimum value.

19. The design method according to claim 18, further comprising the steps of:
- computing a second dimension of the power supply line employing the predetermined minimum value by increasing the computed dimension; and
- comparing the second dimension with the predetermined minimum value, wherein the second dimension is employed as the line dimension when the second dimension is equal to or greater than the minimum value, and wherein the minimum value is employed as the line dimension when the second dimension is less than the minimum value.

20. An apparatus for optimally designing a plurality of power supply lines, wherein the apparatus includes a computation processing unit comprising:
- a checking device for checking a current value of each of the plurality of power supply lines;
- a first computing device for computing a current-capacitance ratio of each of the plurality of power supply lines from an allowable current value and the corresponding current value, wherein the current-capacitance ratio is the ratio of a current amount flowing through each of the power supply lines relative to the current capacitance of each of the power supply lines; and
- a second computing device for computing a dimension of at least one of the plurality of power supply lines so that the corresponding current-capacitance ratio is within a predetermined range.

21. The design apparatus according to claim 20, further comprising:
- an analyzing device for analyzing the plurality of power supply lines including the at least one power supply line having the computed dimension;
- a determining device for determining a voltage drop violation in the plurality of power supply lines; and
- a setting device for setting the computed dimension as the optimal dimension of the at least one power supply line when there is no voltage drop violation.

22. The design apparatus according to claim 20, further comprising a correcting device for correcting the computed dimension when the determining device determines the occurrence of the voltage drop violation in the power supply lines, wherein the analyzing device, the determining device, and the correcting device are repetitively operated until the voltage drop violation is avoided.

23. The design apparatus according to claim 22, wherein the correcting device increases the computed dimension while maintaining the relative relationship between the current-capacitance ratios of the plurality of power supply lines.

24. The design apparatus according to claim 22, wherein the correcting device increases the computed dimension so that a relative value of each current-capacitance ratio approaches a predetermined value.

25. The design apparatus according to claim 20, further comprising a separating device for separating the plurality of power supply lines into subject lines that are subject to optimization and non-subject lines that are not subject to optimization, wherein each device processes the subject lines.

26. The design apparatus according to claim 20, wherein the second computing device includes a comparator for comparing the computed dimension with a predetermined minimum value, the comparator employing the computed dimension as the line dimension when the computed dimension is equal to or greater than the minimum value, and the predetermined minimum value as the line dimension when the computed dimension is lower than the minimum value.

27. A computer readable recording medium having recorded thereon program code for optimally designing a plurality of power supply lines, wherein the program code comprises:

means for checking a current value of each of the plurality of power supply lines;

means for computing a current-capacitance ratio of each of the power supply lines from an allowable current value and the corresponding current value, wherein the current-capacitance ratio is the ratio of a current amount flowing through each of the power supply lines relative to the current capacitance of each of the power supply lines; and means for computing the dimension of each of the plurality of power supply lines so that the corresponding current-capacitance ratio is within a predetermined range.

28. The medium according to claim 27, wherein the program code further comprises:

means for analyzing each of the plurality of power supply lines having the computed dimension;

means for determining the occurrence of a voltage drop violation in the plurality of power supply lines; and means for setting the computed dimension as the optimal dimension of the power supply line when there is no voltage drop violation.

29. The medium according to claim 28, wherein the program code further comprises:

means for correcting the computed dimension when the occurrence of the voltage drop violation in the power supply lines is determined.

30. The medium according to claim 27, wherein the program code further comprises:

means for separating the plurality of power supply lines into subject lines that are subject to optimization and non-subject lines that are not subject to optimization.

31. The medium according to claim 27, wherein the program code further comprises:

means for comparing the computed dimension with a predetermined minimum value, the comparing means employing the computed dimension as the line dimension when the computed dimension is equal to or greater than the minimum value, and the predetermined minimum value as the line dimension when the computed dimension is lower than the minimum value.

32. The medium according to claim 31, wherein the program code further comprises:

means for changing the computed dimension to a greater value in the power supply line employing the predetermined minimum value as the line dimension; and means for comparing the changed dimension with the predetermined minimum value, wherein the changed dimension is employed as the line dimension when the changed dimension is equal to or greater than the minimum value, and wherein the minimum value is employed as the line dimension when the changed dimension is less than the minimum value.

* * * * *